(12) United States Patent
Oak et al.

(10) Patent No.: US 9,188,632 B1
(45) Date of Patent: Nov. 17, 2015

(54) SELF LEARNING RADIO FREQUENCY MONITORING SYSTEM FOR IDENTIFYING AND LOCATING FAULTS IN ELECTRICAL DISTRIBUTION SYSTEMS

(71) Applicant: Siemens Energy, Inc., Orlando, FL (US)

(72) Inventors: Jon Patrick Oak, Fern Park, FL (US); Edward David Thompson, Casselberry, FL (US)

(73) Assignee: Siemens Energy, Inc., Orlando, FL (US)

( * ) Notice: Subject to any disclaimer, the term of this patent is extended or adjusted under 35 U.S.C. 154(b) by 77 days.

(21) Appl. No.: 14/267,345

(22) Filed: May 1, 2014

(51) Int. Cl.
*G01R 31/08* (2006.01)
*G01R 31/28* (2006.01)
*G01R 17/02* (2006.01)

(52) U.S. Cl.
CPC ............ *G01R 31/2834* (2013.01); *G01R 17/02* (2013.01)

(58) Field of Classification Search
CPC ....................................................... H02H 3/06
USPC .............. 324/527, 500, 509, 512; 361/42–50; 700/292–294; 702/57–59, 66, 75; 714/47.1–48
See application file for complete search history.

(56) References Cited

U.S. PATENT DOCUMENTS

| | | | | |
|---|---|---|---|---|
| 6,539,293 B2 * | 3/2003 | Bachtiger | ................ | B61K 9/08 701/20 |
| 6,661,207 B2 * | 12/2003 | Nelson | ...................... | H02H 7/06 307/87 |
| 7,369,057 B2 | 5/2008 | Twerdochlib et al. | | |
| 7,441,173 B2 | 10/2008 | Restrepo et al. | | |
| 7,605,712 B2 | 10/2009 | Twerdochlib et al. | | |
| 2006/0267594 A1 * | 11/2006 | Thompson | ............. | G01R 31/42 324/520 |

* cited by examiner

*Primary Examiner* — Jermele M Hollington
*Assistant Examiner* — Giovanni Astacio-Oquendo

(57) ABSTRACT

Electrical faults are detected in electrical distribution systems (EDS) by detection and location of radio frequency (RF) emissions generated by the fault with multiple time-synchronized radio frequency monitors (RFM) distributed about the EDS. The RFMs are coupled to a self-learning, electrical fault monitor (EFM) that characterizes and/or locates electrical faults based on operating state (OS) patterns learned from transmission of test signals generated within the EDS. RF emissions data samples are characterized as safe operation (SO) states or potential electrical faults by accessing a base of stored knowledge concerning fault emission characteristics and/or synchronized time of arrival at each RFM. Information in the base of stored knowledge is updated to include new EDS operating states (OS). Confidence level associations, location of new radio frequency emission patterns and whether those patterns are indicative of safe operating (SO) conditions or electrical faults are stored in the base of stored knowledge.

18 Claims, 8 Drawing Sheets

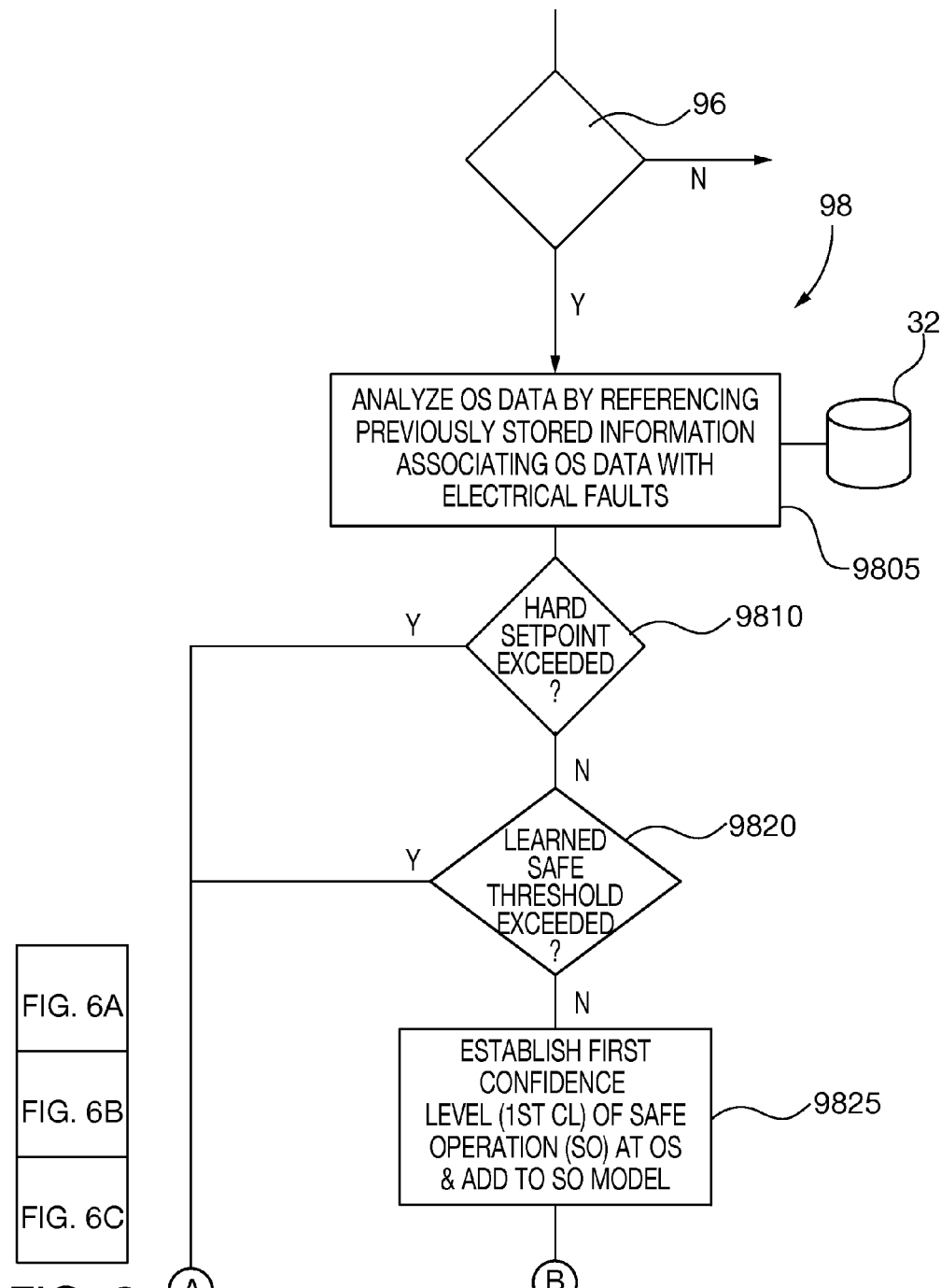

SELF LEARNING RADIO FREQUENCY MONITORING SYSTEM FOR IDENTIFYING AND LOCATING FAULTS IN ELECTRICAL DISTRIBUTION SYSTEMS

BACKGROUND OF THE INVENTION

1. Field of the Invention

The invention relates to electrical fault detection in electrical distribution systems (EDS) by detection and location of radio frequency (RF) emissions generated by the fault. More particularly the invention relates to self-learning radio frequency electrical fault monitor (EFM) systems and methods, having time synchronized distributed radio frequency monitors, wherein the monitoring system is trained to characterize and/or locate electrical faults based on operating state (OS) patterns learned from transmission of test signals generated within the distributions system. During operation, radio frequency emissions from the EDS are evaluated by multiple radio frequency monitors (RFM) as safe operation (SO) or potential electrical faults by accessing a base of stored knowledge concerning fault emission characteristics and/or synchronized time of arrival at each monitor. During evaluation the EFM system establishes one or more levels of confidence factors whether the monitored RF emission characteristics are indicative of electrical distribution system safe operation (SO) condition or an electrical fault its likely location within the EDS. Information in the base of stored knowledge is updated to include new operating states (OS) of the electrical distribution system. Confidence level associations, location of new radio frequency emission patterns and whether those patterns are indicative of safe operating (SO) conditions or electrical faults are stored in the base of stored knowledge.

2. Description of the Prior Art

Electrical conductors produce an electric field with the application of an electrical current. The electrical field profile can be affected by a variety of characteristics of the conductor. One characteristic that can affect the field is cracking in the conductor causing small electrical fault arcs to jump across the crack. Additionally variations in the field may also be caused by imperfections in the insulation that can allow partial electrical fault discharges consisting of very small mini-arcs on the surface of the insulation. An electrical fault arc produces a burst of broad spectrum radio frequency energy as the arc is made and again as it is broken. This applies to various types and severity of electrical fault partial discharge, discharges across bearing oil films due to shaft grounding or pedestal insulation problems, cracks in conductors, or any other kind of arcing. The signature characteristics of the RF emission will be different depending on the source.

Currently, there are several commercially available devices that monitor RF emission activity, specifically for power plant electrical generators. Partial discharge detectors monitor RF activity on the main conductors that carry electricity away from the generator (phase buses) and are typically located between the generator and the main transformer within the power plant electrical distribution system (EDS). They can consist of single sensors or multiple sensors on each phase. The use of multiple sensors can determine if an RF pulse is emanating from the generator or outside the generator by determining the direction the pulse is traveling. An existing known radio frequency monitor (RFM) available from Siemens Energy Inc., detects RF activity at a single point on the generator neutral ground. This approach is lower cost than others are, and will detect electrical fault and other RF activity from other pieces of electrical equipment in the power plant electrical distribution system (EDS), because all the equipment is typically tied to a common EDS ground or earthed phase at some plant location. However, the RFM does not determine the location of the equipment that is causing the RF emission activity: only its existence. Various manual tests and inspections must be made to locate specifically the source of the RF emission anomaly. The fault locating Utility customers find the process cumbersome and do not want the additional burden of finding the source of the problem. Typical plant maintenance practice indicates that the source of such problems become known eventually, usually when the electrical equipment in the EDS fails.

RFM's and other detection systems, such as partial discharge monitors, utilize either bus couplers or other means of voltage isolation so they can directly measure voltage waveforms of power plant equipment. The RFM output is typically observed as a series of RF spikes with quieter periods of lesser activity in between.

Existing electrical fault detection systems and methods do not efficiently isolate location of RF emissions in power plant electrical distribution systems. Those systems do not efficiently characterize whether an RF emission is an indicia of an existing or incipient electrical fault or whether the RF emission is merely part of an EDS operating state that does not negatively impact its safe operation (SO). If the latter, the detected RF emission OS can be discounted as a SO that is acceptable for power plant EDS.

SUMMARY OF THE INVENTION

Accordingly, a suggested object of the invention is the creation of a power plant electrical distribution system (EDS) electrical fault monitor (EFM) system and method, for detecting radio frequency (RF) emissions and their location within the EDS with distributed radio frequency monitors (RFM) and in real time associating the RF emissions with EDS safe operation (SO) or electrical faults, that is flexibly employed and reconfigurable within the power plant, to accommodate changes and upgrades in the EDS configuration and component hardware.

Another suggested object of the invention is the creation of a power plant electrical distribution system (EDS) electrical fault monitor (EFM) system and method for detecting such EDS electrical faults that self-adapts and "learns" programmed and real time operational radio frequency (RF) emissions in the EDS that are detected by radio frequency monitors (RFM) and determines whether it associates the RF emissions with EDS safe operation (SO) or electrical faults in real time.

An additional suggested object of the invention is the creation of a power plant electrical distribution system (EDS) electrical fault monitor (EFM) system and method for detecting such EDS electrical faults that stores "learned" or programmed RF operational state (OS) data in a base of stored knowledge for future reference by the EFM, so that the stored knowledge is subsequently used by the EFM to establish confidence levels whether the OS data are indicative of safe operation (SO) or an electrical fault.

These and other objects are achieved in one or more embodiments of the invention by a power plant electrical distribution system (EDS) electrical fault monitor (EFM) system and method, for detecting radio frequency (RF) emissions with distributed radio frequency monitors (RFM) and in real time associating the RF emissions with EDS safe operation (SO) or electrical faults, that is flexibly employed and reconfigurable in conjunction with a distributed RFM network within the power plant, to accommodate changes and upgrades in the EDS configuration and component hardware.

The EFM stores the RF operational state (OS) data in a base of stored knowledge for future reference by the EFM. The OS data in the base of stored knowledge can be pre-loaded therein based on operational observations of EDS in other power plants. In some embodiments, OS data in the base of stored knowledge includes rules, set points, absolute reading limits, RF waveforms, and time differences between receipt of data samples by different RFMs, historical information, weightings, human inputs or statistical probabilities. The EFM subsequently uses OS information in the base of stored knowledge for associating the RF emissions with EDS safe operation (SO) or electrical faults in real time. In embodiments of the invention, the EFM determination of whether RF emissions are associated with SO or electrical faults is performed by the EFM using any of fuzzy logic, self-learning, algorithmic, statistical, neural network logic, case-based reasoning or heuristic methods. In embodiments of the invention the EFM updates the base of stored knowledge with new OS data, determinations of whether the OS data are associated with SO or an electrical fault, RF emission location within the EDS and confidence level determinations.

Embodiments of the invention feature methods for monitoring electrical faults in a power plant electrical distribution system (EDS) by monitoring and sampling in real time with an EDS electrical fault monitor (EFM) operation state (OS) radio frequency (RF) emissions data from EDS equipment. The emissions data are obtained with a plurality of time synchronized radio frequency monitors (RFM), which are distributed about the EDS and coupled to the EFM. The OS RF emissions are potentially indicative of electrical faults in the EDS. OS data samples for each RFM are stored in an automated data storage device that is coupled to the EFM. Exemplary data samples include identification of the RFM that obtained the sample, data sample time and data sample waveform characteristics. The EFM determines in real time a likelihood of whether one or a combination of the respective OS data samples is indicative of an electrical fault by referencing in an automated data storage device coupled to the EFM previously stored information associating OS data with any one or more of EDS safe operation (SO), electrical faults or RF emission location within the EDS. The EFM compares at least one stored OS sample reading from each RFM with respective stored association information relevant thereto and makes respective EDS safe operation (SO) first confidence level determinations. The EFM compares a combination of the at least one stored OS sample reading from each respective RFM with respective stored association information relevant thereto, if such combination information is available, and makes respective EDS safe operation (SO) second confidence level determinations. Optionally additional confidence level determinations can be made. The EFM combines all prior sequentially determined confidence levels information to derive an EDS safe operation (SO) overall confidence level. The EFM generates an alarm when any of the sequentially determined first through overall SO confidence levels is indicative of an electrical fault within the EDS.

Other embodiments of the invention feature a method for monitoring electrical faults in a power plant electrical distribution system by monitoring and sampling in real time with an EDS electrical fault monitor (EFM) operation state (OS) radio frequency (RF) emissions data from electrical distribution system (EDS) equipment that are obtained with a plurality of time synchronized radio frequency monitors (RFM) distributed about the EDS and coupled to the EFM. The OS RF emissions are potentially indicative of electrical faults in the EDS. An automated data storage device that is coupled to the EFM stores OS data samples for each RFM. The sampled data including the RFM identification, data sample time and data sample waveform characteristics. The EFM determines in real time a likelihood of whether one or a combination of the respective OS data samples is indicative of an electrical fault. The determination is performed by referencing in the automated data storage device that coupled to the EFM previously stored electrical fault information obtained by the RFMs, resulting from generating electrical fault RF test signals with an RF test generator in the EDS. The sampled OS data are compared with the previously stored electrical fault information in the automated data storage device. The EFM generates an alarm when the referenced stored information associates the sampled OS data with an electrical fault within the EDS.

Additional embodiments of the invention feature a system for monitoring electrical faults in a power plant electrical distribution system, including a plurality of time synchronized radio frequency monitors (RFM) that are distributed about the electrical distribution system (EDS). The RFMs monitor and sample in real time EDS operation state (OS) radio frequency (RF) emissions data from electrical EDS equipment. The OS RF emissions are potentially indicative of electrical faults in the EDS. An electrical fault monitor (EFM) is coupled to the RFMs and an automated data storage device, and has stored therein sampled data readings for each RFM. The sampled data includes the RFM identification, data sample time and data sample characteristics. The EFM determines in real time a likelihood of whether one or a combination of the respective OS data samples is indicative of an electrical fault by referencing in the automated data storage device previously stored information associating OS data with any one or more of EDS safe operation (SO), electrical faults or RF emission location within the EDS. The EFM compares at least one stored OS sample reading from each RFM with respective stored association information relevant thereto and makes respective EDS safe operation (SO) first confidence level determinations. A combination of the at least one stored OS sample reading from each respective RFM is compared with respective stored association information relevant thereto, if such combination information is available, in which case the EFM makes respective EDS safe operation (SO) second or more confidence level determinations. The EFM combines all prior sequentially determined confidence levels information to derive an EDS safe operation (SO) overall confidence level; and causes the EFM to generate an alarm when any of the sequentially determined first through overall SO confidence levels is indicative of an electrical fault within the EDS.

When utilizing the EFM system and method embodiments of the invention, faulty electrical equipment in the EDS, including the generator, can be repaired during a scheduled period of down time resulting in higher power plant reliability.

The disclosed invention utilizes an initialization testing method (see FIG. 2) that will produce a series of typical RFM data signatures that can be used to locate the source. A portable RF source will be used to produce a pulse at different locations around the power plant, for example, at the generator neutral ground, at the main transformer primary side phase A, at various motors, etc. The portable device will also have a precise time measurement similar to the RFMs, so the exact time of the pulse initiation is known. The arrival times and magnitude of the generated spikes at each RFM location will form a vector for storage in one or more of the storage devices 32, 34, 58.

The respective objects and features of the present invention, including the exemplary embodiments described herein, may be applied jointly or severally in any combination or sub-combination by those skilled in the art.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

After considering the following description, those skilled in the art will realize that the by the teachings of the present invention electrical faults are detected in electrical distribution systems (EDS) by detection and location of radio frequency (RF) emissions generated by the fault with multiple time synchronized radio frequency monitors (RFM) distributed about the EDS. In embodiments of the invention the RFM location is reconfigurable to accommodate changes in the EDS configuration and/or component hardware. The RFMs are coupled to a self-learning, electrical fault monitor (EFM) that characterizes and/or locates electrical faults based on operating state (OS) patterns learned from transmission of test signals generated within the in the distributions system and/or that are preloaded into an EFM accessible base of stored knowledge. RF emissions data samples are characterized as safe operation (SO) states or potential electrical faults by accessing a base of stored knowledge concerning fault emission characteristics and/or synchronized time of arrival at each RFM. In embodiments of the invention information in the base of stored knowledge is updated to include new EDS operating states (OS). In embodiments of the invention the confidence level associations, location of new radio frequency emission patterns and whether those patterns are indicative of safe operating (SO) conditions or electrical faults are stored in the base of stored knowledge.

Figure 6B:
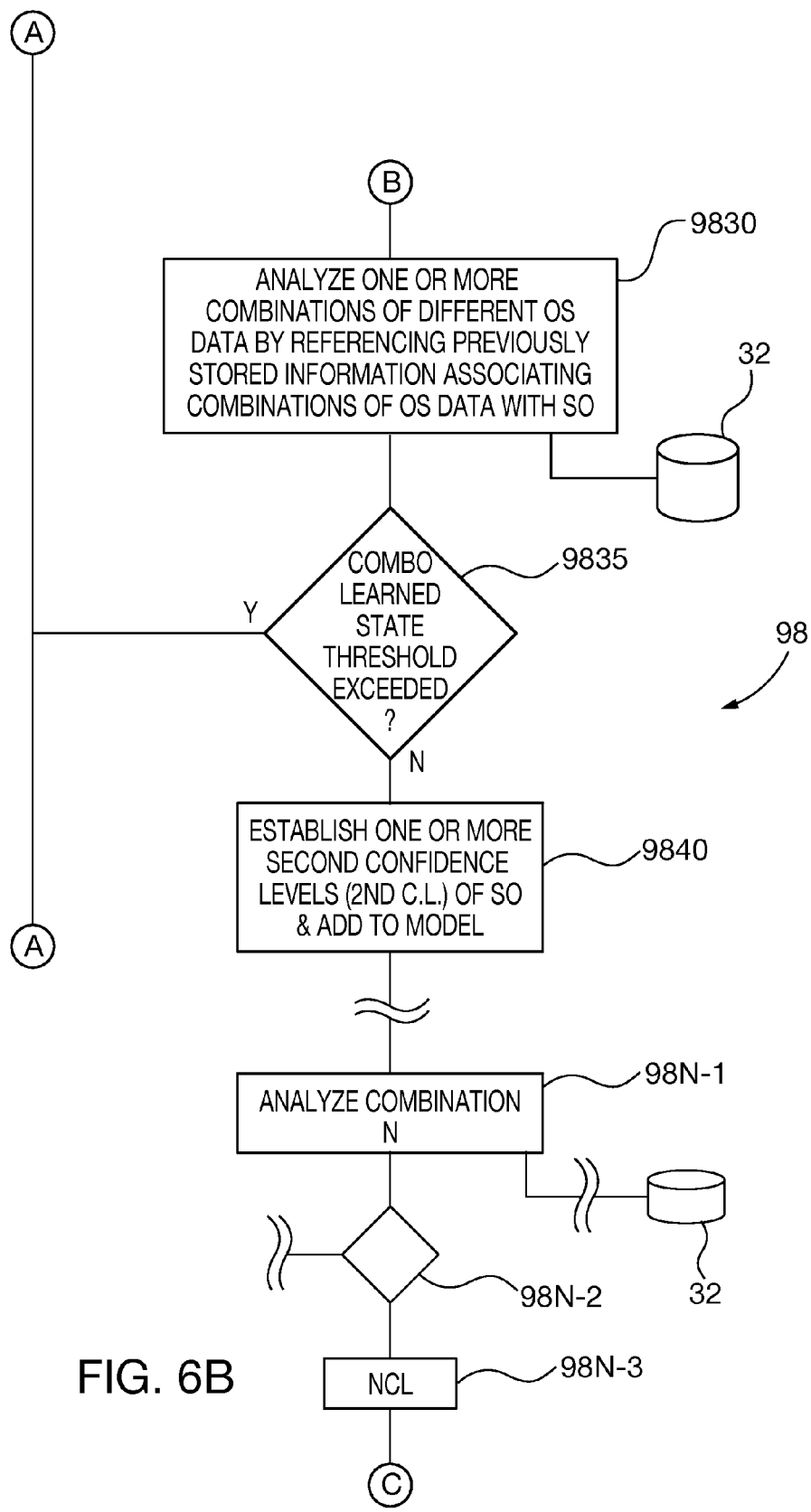
Figure 6C:
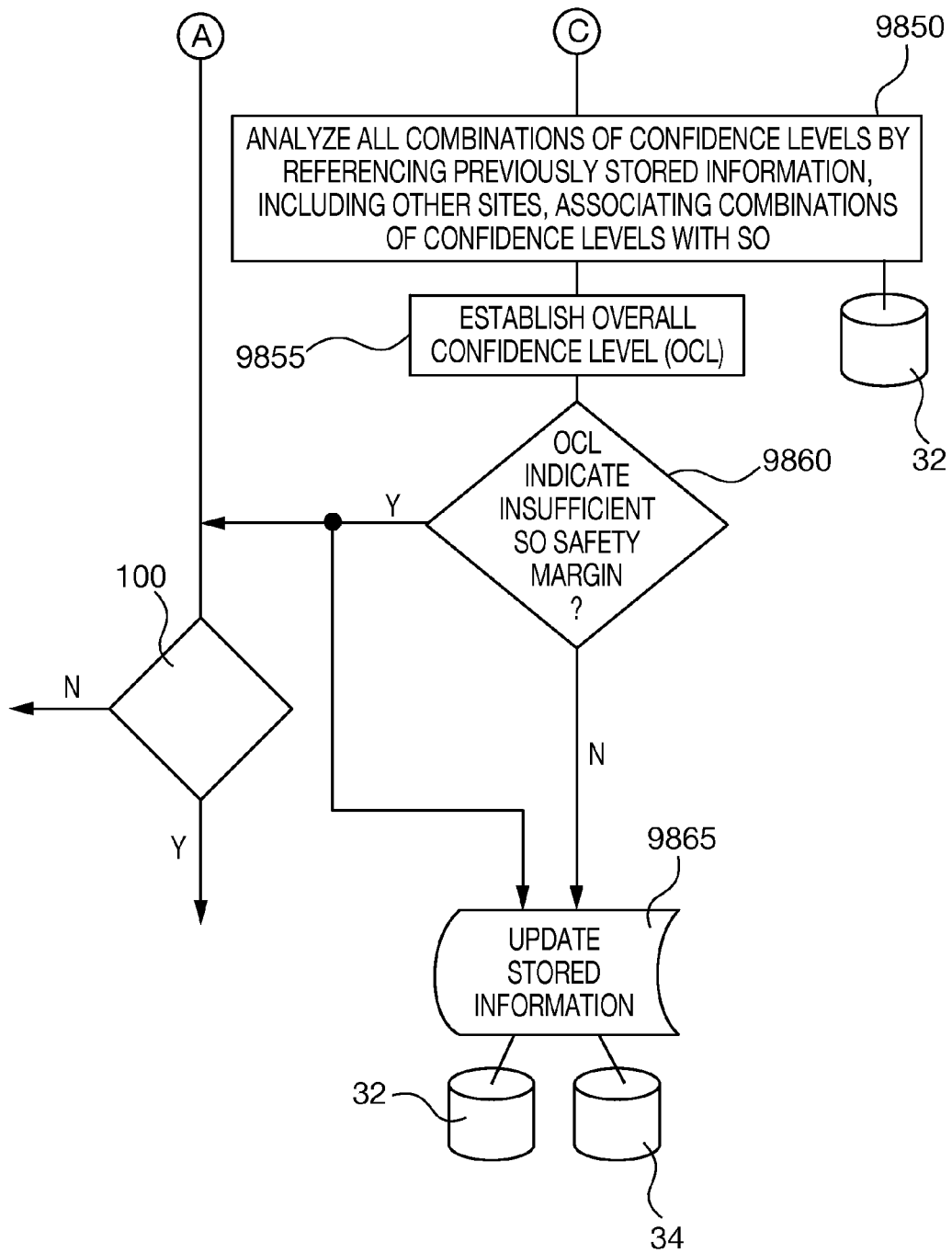

In embodiments of the invention, specific RF emission spikes in the EDS are detected by the RFM network under control of the EFM 30, recording the precise and synchronized measurement of time in addition to at least the magnitude of measured RF spikes, saving the series of RF magnitudes and time readings in a central database as a vector, and comparing that vector to a set of vectors recorded during initialization testing with the TE that will allow advanced pattern matching algorithms to determine a series of likely locations with confidence factors (see FIG. 6). The initialization testing will automatically account for timing not only of the RF spikes through the power plant's structure, but also the timing of the RFM signals themselves through internal or external data transfer wiring, fiber optic cables, wireless data transfer technologies, etc. This testing will compensate for such miscellaneous delays inherent in the entire EFM system, as the RFM system will be recording the initialization test signals in exactly the same way it records the actual RF emission spikes or signals during subsequent EMF live operation within the EDS.

In embodiments of the invention during operation of the EDS the EFM determines in real time a likelihood of whether one or a combination of the respective OS data samples is indicative of an electrical fault by referencing in the automated data storage device previously stored information associating OS data with any one or more of EDS safe operation (SO), electrical faults or RF emission location within the EDS. The EFM compares at least one stored OS sample reading from each RFM with respective stored association information relevant thereto and makes respective EDS safe operation (SO) first confidence level determinations. A combination of the at least one stored OS sample reading from each respective RFM is compared with respective stored association information relevant thereto, if such combination information is available, in which case the EFM makes respective EDS safe operation (SO) second or more confidence level determinations. The EFM combines all prior sequentially determined confidence levels information to derive an EDS safe operation (SO) overall confidence level; and causes the EFM to generate an alarm when any of the sequentially determined first through overall SO confidence levels is indicative of an electrical fault within the EDS.

Electric Fault Monitor (EFM) Hardware Description

Figure 1:
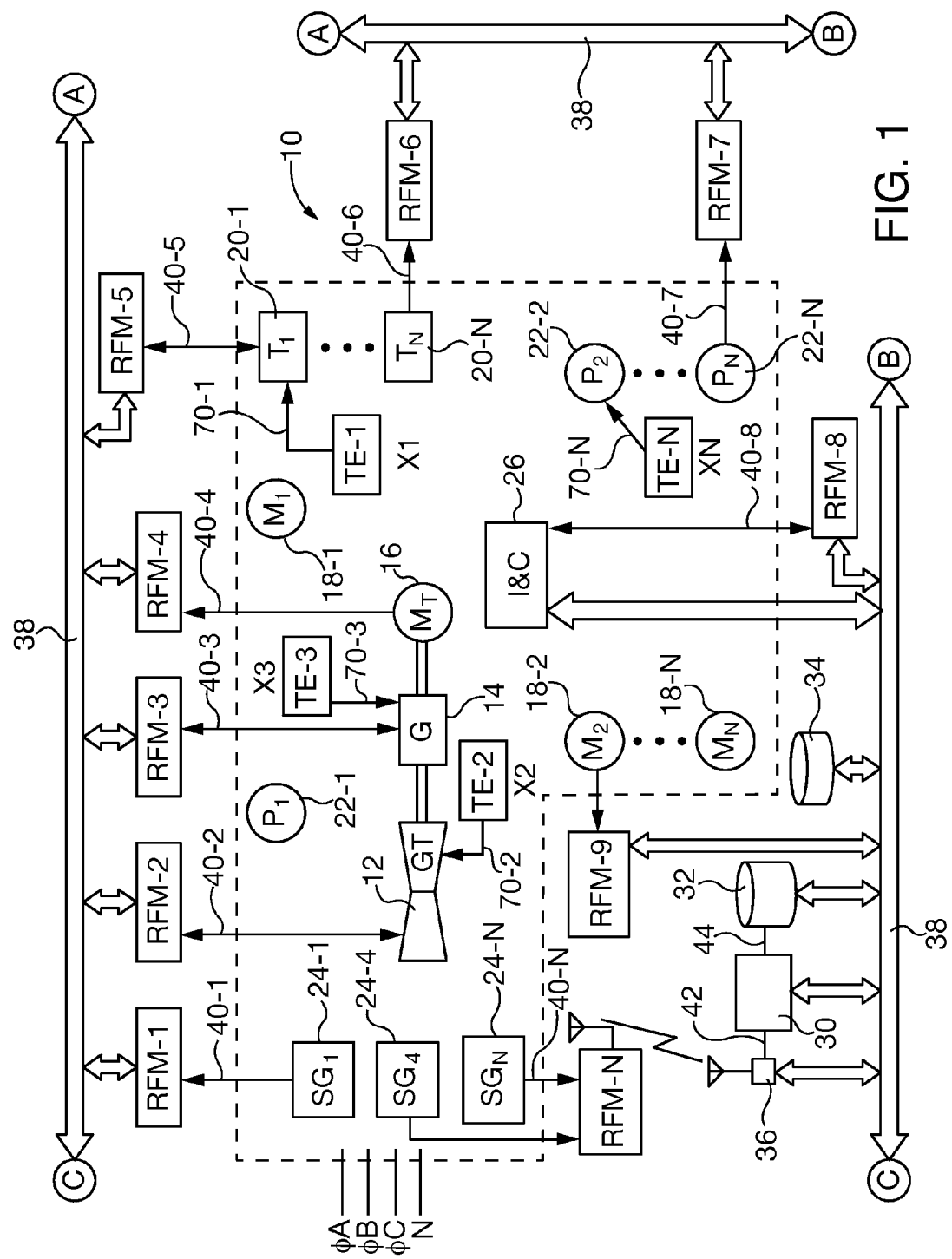
FIG. 1 is a schematic diagram of an embodiment of a power plant electrical distribution system including an electrical fault monitor system (EFM) of the invention; for identifying and locating faults in the electrical distribution system.

An embodiment of the system of the invention as employed in an exemplary known power plant electrical distribution system (EDS) 10, having three phases ΦA, ΦB, ΦC and neutral N is shown in FIG. 1. The EDS 10 includes may include one or more of exemplary known gas turbine 12, generator 14, turning gear motor 16, motors 18, transformers 20, pumps 22, EDS protection distribution and control switch gear/circuit interrupters/circuit breakers 24, power plant instrumentation and control system 26 and any other EDS equipment components.

Figure 2:
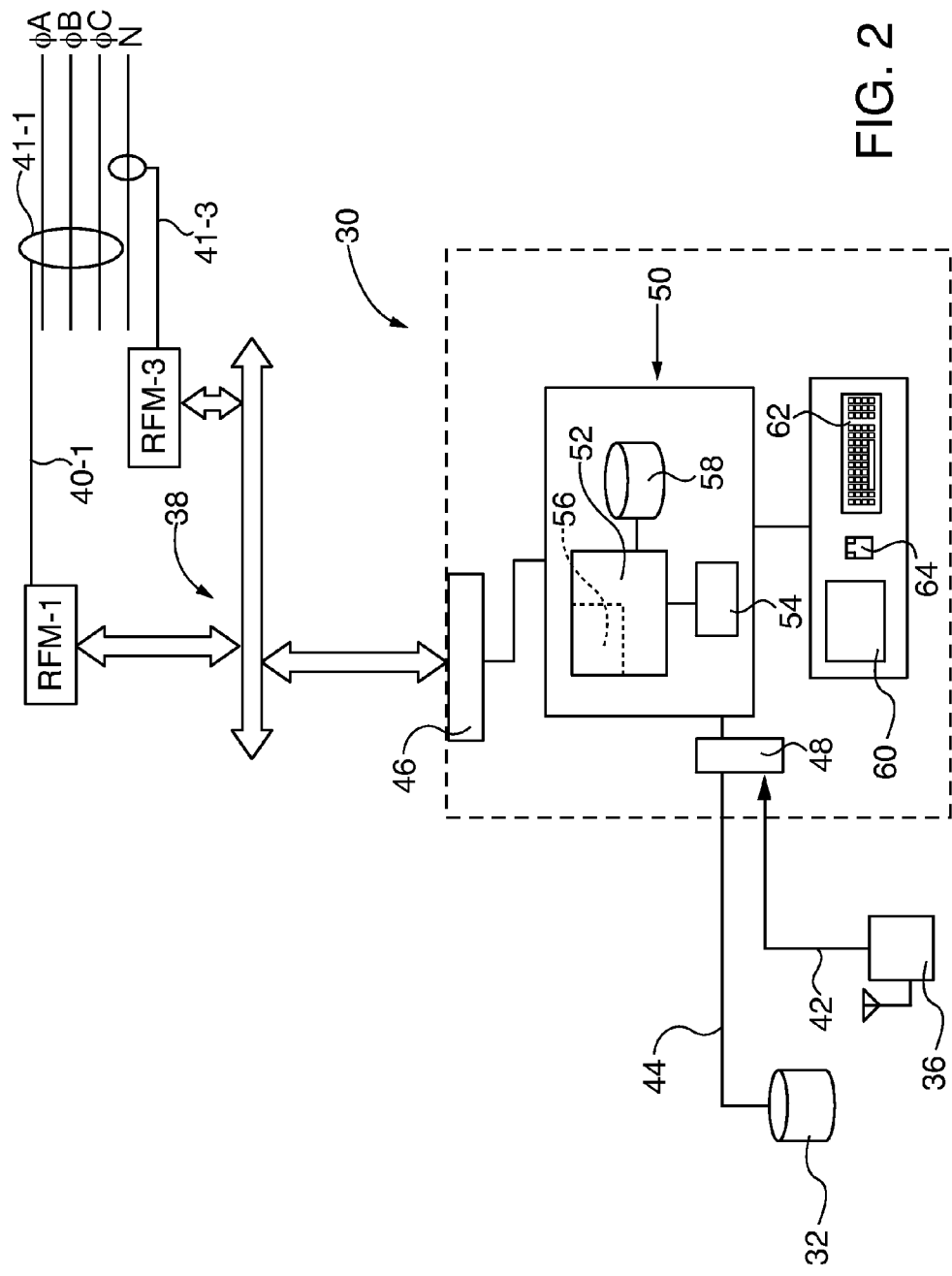
FIG. 2 is a block diagram of an embodiment of the EFM of FIG. 1.

Referring to FIGS. 1 and 2, an embodiment of an exemplary electrical fault monitoring system (EFM) comprises a plurality of radio frequency monitors RFM-1-RFM-N that are selectively distributed about the power plant EDS 10, where they monitor RF emissions from EDS equipment components (e.g., generator 14, motors 16 or 18, transformers 20, pumps 22, switchgear 24, etc.). The EFM also comprises an EFM control system 30 that is communicatively coupled to the RFMs; an EFM network database 32 that includes a base of stored knowledge for determining wither an RF transmission received by an RFM is associated with an EDS 10 safe operation (SO) state or an electrical fault; any other EFM-accessible database(s) 34; wireless transceiver 36; and EFM data network 38.

The EFM data network 38 that is shown in FIGS. 1 and 2 includes exemplary known bi-directional networked data busses, wireless transceivers (e.g., RFM-N to transceiver 36), and other known types of conductive communications pathways (fiber optic, hard wired, twisted pair cables, coaxial cables, etc.). In the data network 38 the radio frequency monitors RFM-1-RFM-N are selectively distributed about the power plant EDS 10 and can be reconfigured selectively to accommodate alterations in the EDS configuration and/or electrical components by coupling sensors 40-1-40-N to electrical equipment or power distribution phase busways between electrical equipment. As shown in FIG. 2, exemplary RFM sensors include multi-phase arc sensor 41-1 to RFM-1 and single-phase sensor 41-3 to RFM-3. Also in FIG. 2 an exemplary wireless transceiver 36 is communicatively coupled to RFM-N and the controller 30 by way of an Input/output interface 48. As shown the same I/O interface 48 is also coupled to the network database known automated storage device 32 (e.g., data processing system hard drive or other mass data storage device) by communications pathway 44. Communication between the controller 30 and data busses of the data network 38 is also facilitated by communications module interface 46.

As shown in FIG. 2, the EFM control system 30 (also referred to herein as the RFM Network Controller) includes a controller 50 that has a processor 52, memory 54 coupled to the processor and software modules 56 that when executed by the processor causes the system to monitor power plant EDS operating conditions, including respective RF emissions waveforms detected by the RFMs, and determine the likelihood of whether the monitored RF emission operating states, alone or in combination, are indicative of an EDS safe operating (SO) condition or an electrical fault, using the steps subsequently described herein. The controller 50 may be incorporated in the power plant instrumentation and control system 26 or as a stand-alone dedicated hardware platform, such as a known programmable logic controller or a personal computer utilizing a known operating system. The controller 50 and its processor 52 have access to a data storage device 58, which may include a disc drive, non-volatile solid state memory, firmware or the like. The storage device 58 may be incorporated into the controller 50 or be coupled to and remotely accessible to the controller. Data storage device 58 includes previously stored information (loaded or "learned" during EDS operation) that associates respective types of power plant EDS RF emission operating states (OS) with EDS safe operation or a potential electrical fault. The stored information may include by way of non-limiting example rules, set points, absolute reading limits, historical information, weightings and statistical probabilities. The storage device may extract, transfer or share previously stored information with any of the other communicatively coupled data storage devices 32 or 34. A human machine interface (HMI) is coupled to the controller 50, and may include a visual display or monitor 60, a keyboard 62, a mouse or joystick 64 or other known HMI devices (e.g., tablet or personal computer). The HMI may be used to configure or monitor the EFM, modify the stored information in the system data storage device 58 or other storage devices 32, 34, and allow human operator interaction and control over the EFM system.

In response to an observed operating condition indicating an electrical fault in the EDS, the EFM system, directly or indirectly through the plant control system 26 may automatically operate, enunciate or alarm for human operation output devices. For example the EFM system may automatically communicate electrical power disconnection commands to the switchgear 24 to trip circuit interrupters/circuit breakers if the electrical fault conditions warrant such action but under lesser detected fault conditions send an alarm communication to the power plant operators for their evaluation and subsequent action. As previously noted the controller 50 is respectively in communication with the various plant system detection and control devices by respective communications pathways, which may include by way of non-limiting example wireless signal, known metallic cable including twisted pair wiring, co-axial, multiple conductor wire cable, optical cable and data busses employing known communications protocols. Additionally the controller 50 may be in communication with other devices within or remote from the power plant including by way of non-limiting example wireless receiver/transmitters, other facility command and control systems, remote monitoring stations and remote data storage/web hosting/data access sites.

In accordance with embodiments of the invention the EFM control system 30 "learns" RF emission operation states (OS) of the EDS 10 by generating test RF signals $S_{IN}$ at selected locations and times about the EDS with one or more known calibration testers TE-1-TE-N by tester output 70 and test signal transducer 72 into one or more of the EDS phases ΦA-C, N. One or more time synchronized RFMs monitor the resultant emission signal or signature $S_{OUT}$ via associated sensor 41 and transmit OS information about that resultant emission to the EFM control system 30 by way of a previously described data network 38 communications pathway. Resultant RF emission $S_{OUT}$ exemplary OS information from the RFMs may include time of signal receipt, which when synchronized with the TE $S_{IN}$ time of emission provides time-of-flight OS information useful for the EFM control system 30 to time associate location of the RF emission $S_{IN}$ relative to the associated RFM that recorded the emission signature $S_{OUT}$. Other emission signature $S_{OUT}$ exemplary OS information includes emission waveform capture potential, frequency distribution and amplitude characteristics. Additional OS information and parameters can be added to RFM data capture in order to enhance potential electrical fault identification, such as the OS RF pulse main frequency component, pulse shape classification, descriptive parameter and rates of attenuation for various frequency components. For convenience the $S_{OUT}$ test RF information and any other RF emissions monitoring information conveyed by the RFMs to the EFM control system 30 may comprise vectors including the synchronized time information $t_{1-N}$ and waveform characteristics $V_{1-N}$ in any known communications packaging and transmission protocol. The term "signal" is used herein interchangeably with the term spectral characteristics respecting the RF emissions and is not intended to imply that the RF emission is being used as a carrier medium for other types of communication any more than intention the raw power waveform distributed within the EDS 10 acts as an information communications medium.

Electric Fault Monitor (EFM) Operation

As previously noted the EFM system 30 monitors operation states (OS) of power plant EDS 10 power transmission equipment in real time and stores OS samples. The EFM system 30 determines a likelihood of whether a monitored OS reading, alone or in combination with other readings, is indicative of an EDS 10 safe operation (SO) condition with sufficient safety margin for statistical variations or whether the OS reading constitutes an electrical fault. As a general overview, the EFM 30 performs the following tasks in any order. The EFM system 30 references previously stored information in an information storage device that associates respective types of OS readings from each monitored RFM with EDS operating or operation states (OS), and establishes first safe operation (SO) determination confidence levels (CL). If such information is available optionally the system also compares a combination of OS sample readings from multiple RFMs and/or over multiple time sampling windows and establishes a second SO confidence level, and potentially additional sequential SO confidence levels. The EFM system 30 also combines all desired confidence levels information to derive an overall confidence level of whether the EDS 10 RF emissions monitored by the RFMs jointly or severally are within a safe operating (SO) condition or are indicative of an electrical fault. An enunciation, alarm or automated reaction response is initiated if the overall confidence level does not indicate a likelihood of safe operation, depending upon the severity of the monitored situation. For example, a fault determination above a defined threshold may cause automatic switchgear 24 tripping to interrupt electrical power transmission within all or a defined sub-portion of the EDS 10, whereas a fault determination above a lower defined threshold may initiate a lower level of urgency response (e.g., alarm or other enunciation), depending upon the overall confidence level.

Preferably, the present invention is implemented in software as a program or plural program modules tangibly embodied on a program storage device. The program may be uploaded to, and executed by, a machine comprising any suitable architecture. As previously described herein, preferably the controller 50 is implemented on a computer platform having hardware such as one or more central processing units (CPU), a random access memory (RAM), and input/output (I/O) interface(s). The computer platform also includes an operating system and microprocessor instruction code. Both the various processes and functions described herein may be part of the microprocessor instruction code or part of the program (or combination thereof), which is executed via the operating system. In addition, various other peripheral devices may be connected to the computer platform such as an additional data storage device 32, 34 or 58 and various output devices.

Figure 3:
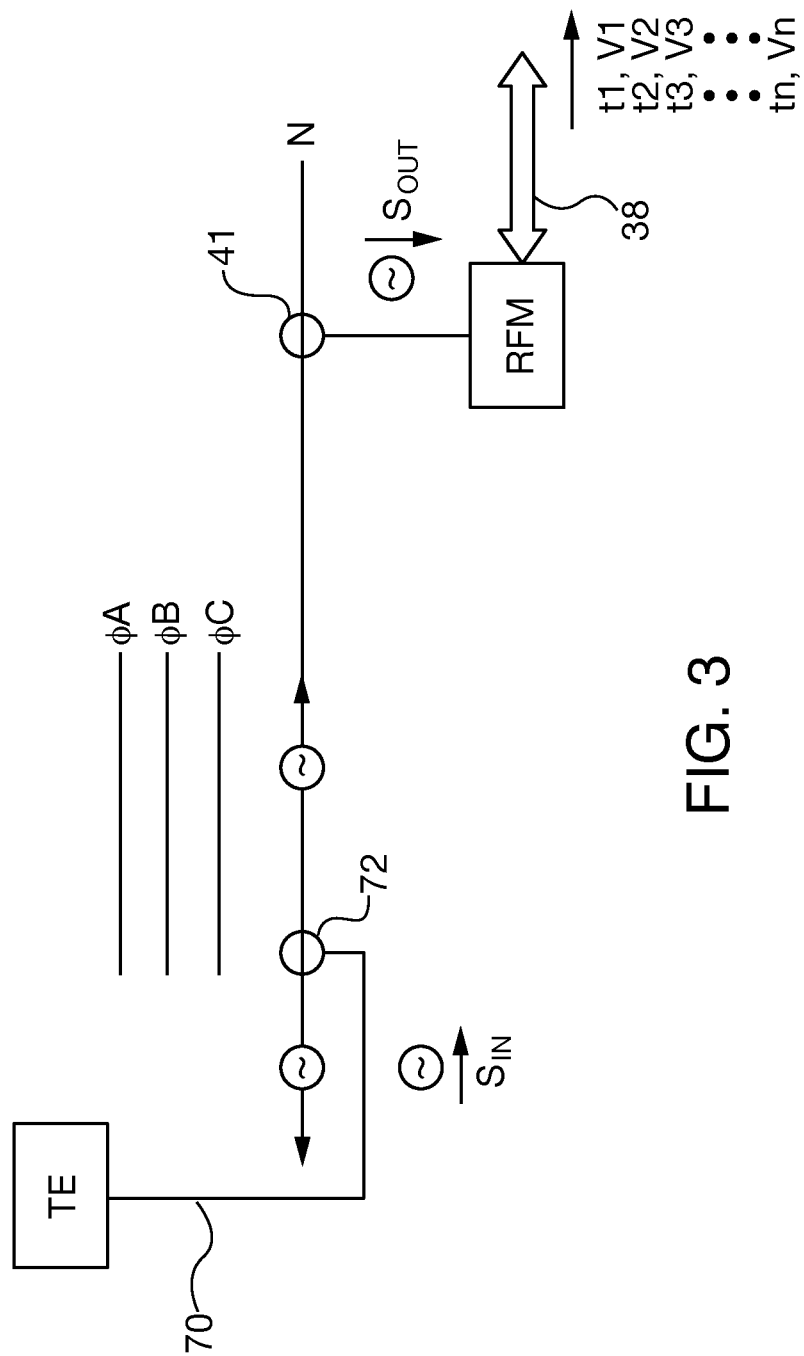
FIG. 3 is a block diagram of an embodiment of a radio frequency test generator of the invention that is used to introduce RF test signals into the EDS during EFM "learning" mode, in order to populate the EFM's stored information associating the EDS operating state (OS) data with any one or more of EDS safe operation (SO), electrical faults or RF emission location within the EDS.
Figure 4:
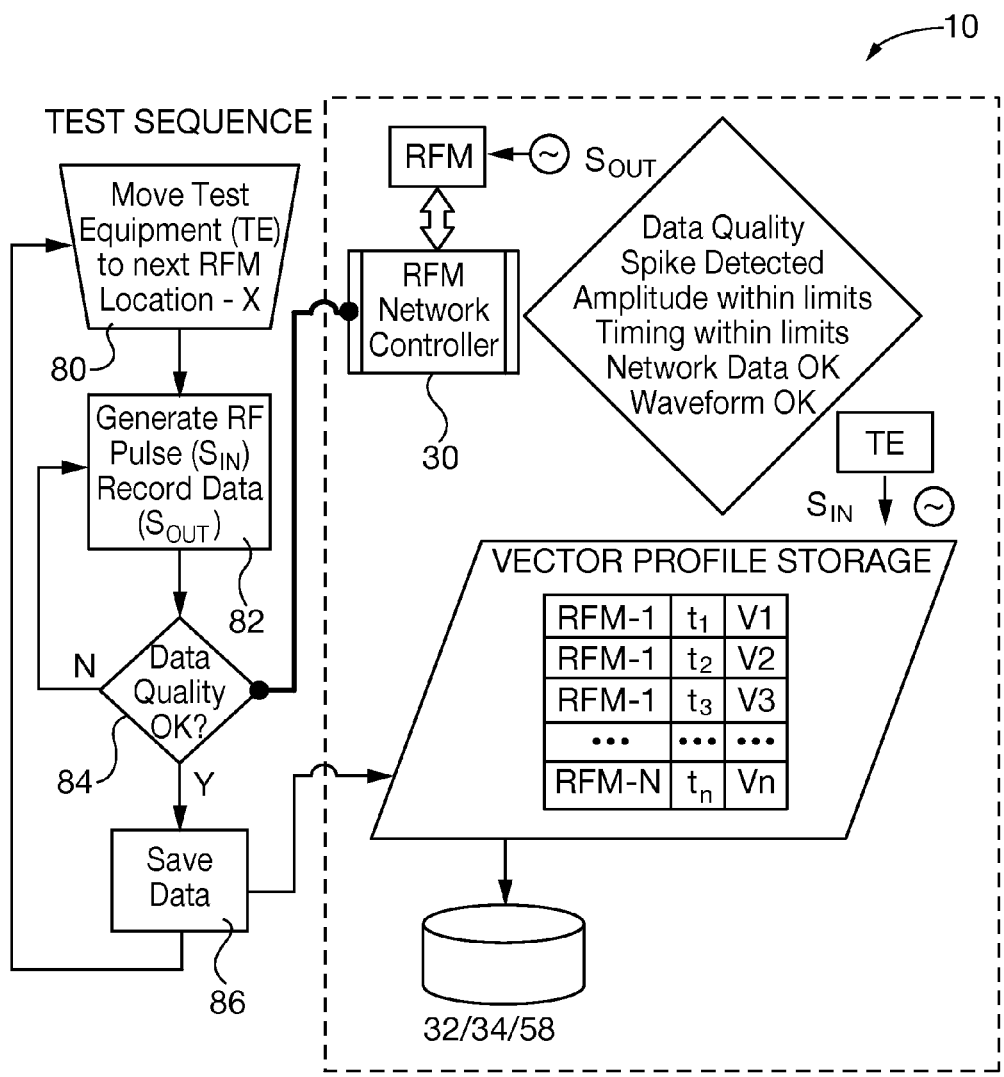
FIG. 4 is a flowchart schematic diagram of an embodiment of a method for operating the radio frequency test generator of FIG. 3 and the EFM of FIGS. 1 and 2 within the power plant EDS, in order to populate the EFM's stored information associating the EDS operating state (OS) data with any one or more of EDS safe operation (SO), electrical faults or RF emission location within the EDS.

It is advantageous to initialize the EFM system 30 base of stored knowledge (e.g., in the automated storage devices 32, 34 or 58) with preloaded operating state (OS) data and/or other data. FIG. 4 shows and exemplary embodiment of the test sequence for the test equipment for transmitting an RF emission $S_{IN}$ within the EDS 10 and capturing the RF emission characteristics $S_{OUT}$ with the RFMs. In step 80 one or more test equipment apparatus TE is moved about to different designated locations TE-1-TE-N within the EDS 10 and coupled to EDS equipment, as shown in FIGS. 1 and 3. In step 82 the TE generates one or more RF pulses $S_{IN}$ at designated times and the transmitted data $S_{OUT}$, is recorded by the RFM. $S_{IN}$ data qualities are verified at step 84 by either or both of the RFM and the controller 50 of the EFM system 30. Examples of data quality verification include by way of non-limiting example whether the RF spike pulse was detected, amplitude of the waveform and timing within designated limits, network data transmission accuracy and waveform characteristics. Unsatisfactory data are rejected and the pulse transmitted repeated. Satisfactory quality $S_{OUT}$ data are saved at step 86 in one or more of the data storage devices 32, 34, 58 in a desired format, such as a vector including: the RFM identification; time t of the pulse receipt (synchronized with TE pulse generation time and other RFM sampling and/or clocks); and desired waveform characteristic(s) V, and transferred to the EFM 30 controller 30. The RFM OS data can be represented as single or multidimensional arrays or vectors. The data can be stored in any format such as flat files, relational database, or other means. Various techniques for matching operational data sets to the TE testing acquired initialization OS data sets can be used. These variations in techniques result in a similar outcome of determining a list of potential RF sources with confidence factors, by comparing a pattern of RF data from a network of RFM's to expected patterns determined by initialization testing with the TE and resultant EFM system 30 "learning". Additional data derived from other sources (such as learned from operation of other power plant electrical distribution systems within the same or different power plants or laboratory experimentation) may be preloaded into the EFM 30 data storage devices 32, 34, 58 to pre-populate the base of stored knowledge before or any time after initial operation of the EFM/RFM network controller 30.

Figure 5:
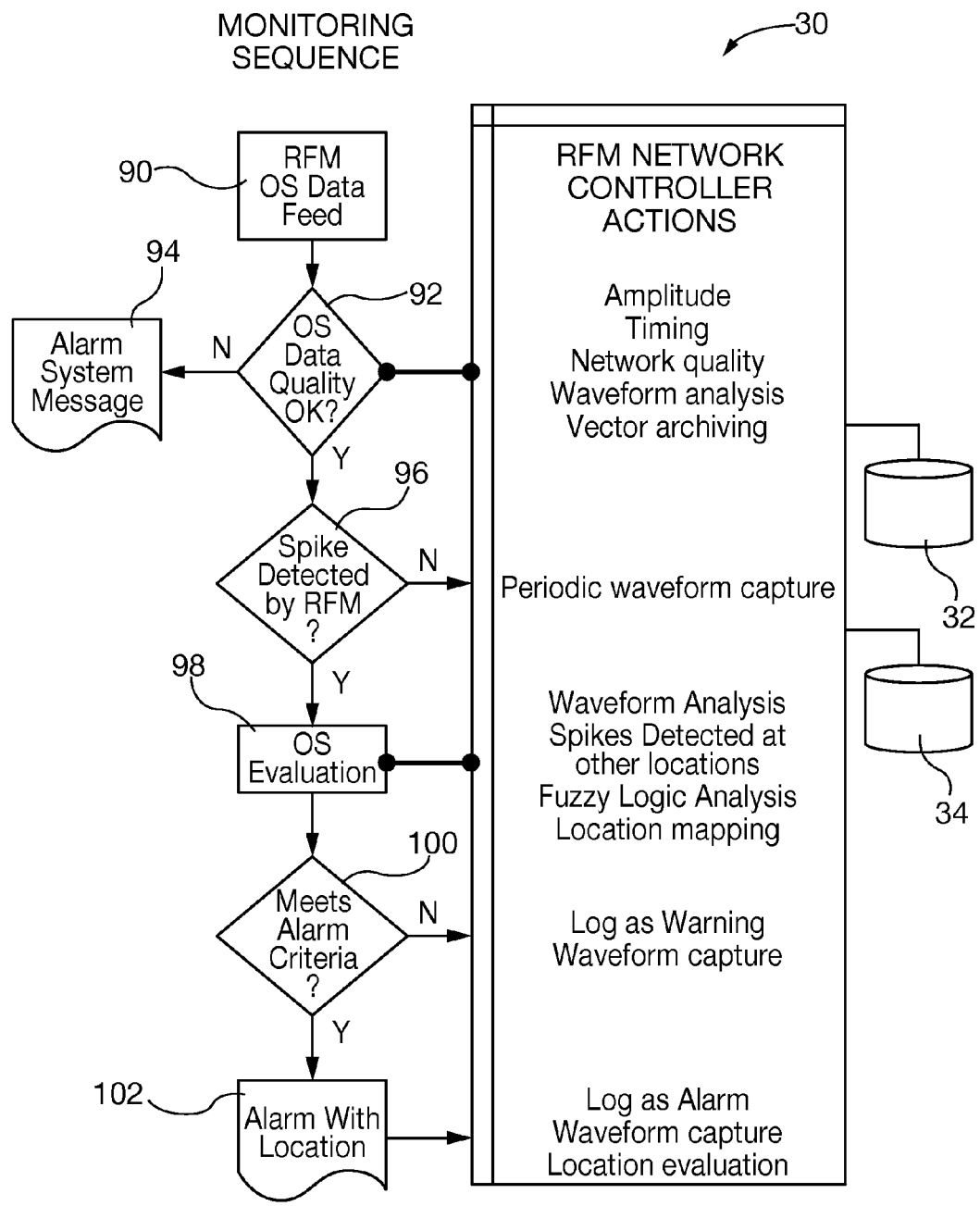
FIGS. 5 and 6 are flowchart schematic diagrams of embodiments of methods for operating an EFM in a power plant EDS using the system of FIGS. 1 and 2.

Monitoring sequence of the EFM/RFM network controller 30 during EDS 10 electrical fault monitoring are shown in the flow charts of FIGS. 5 and 6. In step 90 the RFMs feed operational state (OS) data to the EFM 30 and data quality are verified in step 92 as previously described in connection with the test equipment TE test pulse sequence. Satisfactory quality OS data meeting amplitude, timing, network quality, waveform analysis and vector archiving standards are stored in the data storage devices, such as internal data storage device 58 of the EFM 30 or the shown data storage devices 32, 34. If data quality do not meet standards an alarm system message is sent to the instrumentation and control system 26 or other output location in step 94. Satisfactory data are archived. When an RF emission spike within the EDS 10 is detected by one or more RFMs the transmitted operation state OS data are evaluated by the EFM 30 at step 98. The evaluation includes received RF pulse waveform analysis of RF spikes detected at plural locations by different RFMs, RF pulse location mapping by pulse receipt time synchronization interpolation between different RFM nodes or other known location interpolation methods. All RFM's preferably having a synchronized time reading or synchronized sampling rates, so an exact time, such as GMT in nanoseconds, can be recorded and compared. Such a time representation can be accomplished by the use of atomic clocks, which are now readily available and low cost and sometimes exist on a single chip, or by the use of multi-channel RFM analyzer that is capable of reading all the RFM signals from multiple sensor locations within the power plant EDS simultaneously. Typically in EDS operation the RF pulse is series of salient spikes that can be tracked by multiple RFMs at precise times as the spikes propagate through the power plant and is read at various locations, so that the RF spike source can be identified by subsequently reviewing the track path and timing.

OS data vectors from prior EFM system 30 initialization TE test locations are stored in a database within one or more of the data storage devices 32, 34, 58 that will also house the live monitored RFM operating data. If an RF pulse is detected by any RFM in the network of RFM's, the EFM 30 analysis software will attempt to evaluate and match the resulting pulse location vector(s) with those stored during the initialization testing. The OS electrical fault or OS evaluations are performed by the EFM 30 controller 50 by known evaluation methodologies, such as rules, set points, absolute reading limits, historical information (including human experiential and judgmental historical information) fuzzy logic, case based reasoning, self-learning neural networks, Principle Component Analysis, or other input or rule-based process. The evaluation of OS data taken at different RFM times and locations may be performed in parallel or sequentially for each OS, or in any combination or sub-combination desired for a monitoring function. The RFM will then produce a list of one or more locations, each with a confidence factor based on how closely the vector(s) match initialization data. If the RFM pulse vector does not precisely match any of the TE test stage or other pre-loaded initialization vectors, a list of potential sources will be produced, each with a confidence factor based on how closely the data vector matches those in the set of the initialization vectors. A location between initialization locations, or related to specific locations, can be surmised by a data vector that produces lower confidences in two or more locations.

In embodiments of the invention the OS evaluation process performed in step 98 includes one or more sequential confidence factor determinations of whether the RF emission OS data samples for each RFM are indicative of EDS 10 safe operation (SO) or an electrical fault, as further described in conjunction with the more detailed flow chart of FIG. 6, in which step 98 is further explained with the 9800 et seq. series of steps. In step 9805 the OS data are analyzed by referencing the previously stored information associating OS data with electrical faults and safe operation (SO). The EFM 30 determines whether the OS data exceeds a "hard" set point or absolute ceiling reading (e.g., voltage, current, and rate of current change, detected frequencies or frequency spectrum) or a previously learned safe threshold in step 9820, in which case the OS data meet alarm criteria in step 100. When meeting alarm criteria, the EFM 30 may undertake a range of action, depending upon the severity of the determined electrical fault, that warrants action ranging from tripping or interrupting electric power transmission in the relevant parts of the EDS with switchgear 24 or in step 102, sending an alarm with location of the detected fault to the plant operators and/or the instrumentation and control system 26 for further evaluation. As part of the alarm criteria determination of step 100 the event is logged by the EFM 30 and the relevant OS waveform and/or other OS data are captured for storage.

Referring back to FIG. 6, if OS data do not exceed hard set points or learned safe thresholds, a first confidence level of safe operation (SO) is established and stored and added to the SO model in the base of stored knowledge. Confidence level determination is performed by the EFM 30 without human intervention using any one or more of fuzzy logic, self-learning, and algorithmic, statistical or heuristic methods in the controller 50. The confidence level evaluations are performed in real time for other OS data received from the same RFM and other RFMs. In step 9830 one or more combinations of different OS data from the same RFM and/or other RFMs are evaluated by referencing the base of stored information associating combinations of OS data with SO and electrical fault determinations. For example, a combination of RF spike OS detected in the gas turbine 12 electrical system by RFM-2 and RF spike OS simultaneously detected in the generator 14 electrical windings by RFM-3 may be indicative of an impending generator malfunction that exceeds a learned state threshold in step 9835, necessitating taking the turbine/generator pair offline. If the combination learned state threshold is not exceeded one or more second confidence levels of safe operation (SO) may be established and added to the SO model in the base of stored knowledge as new EFM system learning. Additional sequential N confidence levels (NCL) may be analyzed in steps 98N-1-98N-3. In step 9850 all prior confidence levels are analyzed in combination by referencing previously stored information, which may include other power plant EDS or EDS in other power plant locations to establish an overall confidence level in step 9855. If the overall confidence level indicates sufficient safe operation SO safety margin the stored information in the base of stored knowledge (e.g., in the data storage devices 32, 34 or 58) is updated to include the newly learned additional SO confidence information for future operational use by the EFM.

Although various embodiments, which incorporate the teachings of the present invention, have been shown and described in detail herein, those skilled in the art can readily devise many other varied embodiments that still incorporate these teachings. The invention is not limited in its application to the exemplary embodiment details of construction and the arrangement of components set forth in the description or illustrated in the drawings. For example, in order to facilitate a clear understanding of the present invention, illustrative examples have been provided herein which described certain aspects of the invention system hardware and architecture. However, it is to be appreciated that these illustrations are not meant to limit the scope of the invention, and are provided herein to illustrate certain concepts associated with the invention. It is also to be understood that embodiments of the present invention may be implemented in various forms of hardware, software, firmware, special purpose processors, or a combination thereof. It is to be understood that, because some of the constituent system components and method steps depicted in the accompanying figures are preferably implemented in software, the actual connections between the system components (or the process steps) may differ depending upon the manner in which the present invention is programmed. Specifically, any of the computers or devices may be interconnected using any existing or later-discovered networking technology and may also all be connected through a larger network system, such as a corporate network, metropolitan network or a global network, such as the Internet. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings.

What is claimed is:

1. A method for monitoring electrical faults in a power plant electrical distribution system, comprising:

monitoring and sampling in real time with an EDS electrical fault monitor (EFM) operation state (OS) radio frequency (RF) emissions data from electrical distribution system (EDS) equipment that are obtained with a plurality of time synchronized radio frequency monitors (RFM) that are distributed about the EDS and coupled to the EFM, the OS RF emissions potentially indicative of electrical faults in the EDS;

storing in an automated data storage device that is coupled to the EFM OS data samples for each RFM, sampled data including the RFM identification, data sample time and data sample waveform characteristics;

determining with the EFM in real time a likelihood of whether one or a combination of the respective OS data samples is indicative of an electrical fault by:

referencing in an automated data storage device coupled to the EFM previously stored information associating OS data with any one or more of EDS safe operation (SO), electrical faults or RF emission location within the EDS;

comparing at least one stored OS sample reading from each RFM with respective stored association information relevant thereto and making respective EDS safe operation (SO) first confidence level determinations;

comparing a combination of the at least one stored OS sample reading from each respective RFM with respective stored association information relevant thereto, if such combination information is available, and making respective EDS safe operation (SO) second or more confidence level determinations; and combining all prior sequentially determined confidence levels information to derive an EDS safe operation (SO) overall confidence level; and causing the EFM to generate an alarm when any of the sequentially determined first through overall SO confidence levels is indicative of an electrical fault within the EDS.

2. The method of claim 1, further comprising updating previously stored SO information in the automated data storage device with additional information derived from performing any of the previous steps.

3. The method of claim 2, further comprising performing sequentially one or more additional confidence level determinations after the second confidence level determination.

4. The method of claim 1, wherein the determining step is performed by the EFM using any of fuzzy logic, self-learning, algorithmic, statistical, neural network logic, case-based reasoning or heuristic methods.

5. The method of claim 1, wherein the previously stored information in the automated data storage device comprises any of rules, set points, absolute reading limits, RF waveforms, time differences between receipt of data samples by different RFMs, historical information, weightings, human inputs or statistical probabilities.

6. The method of claim 1, the previously stored information comprising sampled data obtained by the RFMs resulting from generating RF test signals with an RF test generator.

7. The method of claim 1, further comprising the EFM locating the RF emission source within the EDS based on correlation of respective data sample time and/or respective data sample attenuation obtained from multiple RFMs.

8. The method of claim 7, further comprising:
the previously stored information in the automated data storage device including sampled data obtained by the RFMs resulting from generating RF test signals with an RF test generator;
updating previously stored SO information in the automated data storage device with additional information derived from performing any of the previous steps with the EFM;
the determining step performed in the EFM using any of fuzzy logic, self-learning, algorithmic, statistical, neural network logic, case-based reasoning or heuristic methods; and
the previously stored information in the automated data storage device including any of rules, set points, absolute reading limits, RF waveforms, time differences between receipt of data samples by different RFMs, historical information, weightings, human inputs or statistical probabilities.

9. A system for monitoring electrical faults in a power plant electrical distribution system, comprising:
a plurality of time synchronized radio frequency monitors (RFM) that are distributed about the electrical distribution system (EDS), for monitoring and sampling in real time EDS operation state (OS) radio frequency (RF) emissions data from electrical EDS equipment, the OS RF emissions potentially indicative of electrical faults in the EDS;
an electrical fault monitor (EFM) coupled to the RFMs and an automated data storage device having stored therein sampled data readings for each RFM, sampled data including the RFM identification, data sample time and data sample characteristics, the RFM determining in real time a likelihood of whether one or a combination of the respective OS data samples is indicative of an electrical fault by:
referencing in the automated data storage device coupled to the EFM previously stored information associating OS data with any one or more of EDS safe operation (SO), electrical faults or RF emission location within the EDS;
comparing at least one stored OS sample reading from each RFM with respective stored association information relevant thereto and making respective EDS safe operation (SO) first confidence level determinations;
comparing a combination of the at least one stored OS sample reading from each respective RFM with respective stored association information relevant thereto, if such combination information is available, and making respective EDS safe operation (SO) second or more confidence level determinations;
combining all prior sequentially determined confidence levels information to derive an EDS safe operation (SO) overall confidence level; and
causing the EFM to generate an alarm when any of the sequentially determined first through overall SO confidence levels is indicative of an electrical fault within the EDS.

10. The system of claim 9, the automated storage device having stored therein additional SO information derived from performing any of the prior EFM determining steps.

11. The system of claim 9, the automated storage device having stored therein additional SO information derived from performing prior electrical fault monitoring during EDS operation in the power plant.

12. The system of claim 9, the EFM sequentially performing one or more additional confidence level determinations after the second confidence level determination.

13. The system of claim 9, the EFM performing the determining step using any methods including fuzzy logic, self-learning, algorithmic, statistical, neural network logic, case-based reasoning or heuristic methods.

14. The system of claim 9, wherein the previously stored information in the automated data storage device comprises any of rules, set points, absolute reading limits, RF waveforms, time differences between receipt of data samples by different RFMs, historical information, weightings, human inputs or statistical probabilities.

15. The system of claim 9, the previously stored information comprising sampled data obtained by the RFMs resulting from generating RF test signals with an RF test generator.

16. The system of claim 9, further comprising:
the automated data storage device previously stored information including sampled data obtained by the RFMs resulting from generating RF test signals with an RF test generator and additional SO information derived from performing prior electrical fault monitoring during EDS operation in the power plant;
the determining step performed in the EFM using any of fuzzy logic, self-learning, algorithmic, statistical, neural network logic, case-based reasoning or heuristic methods; and
the previously stored information in the automated data storage device including any of rules, set points, absolute reading limits, RF waveforms, time differences between receipt of data samples by different RFMs, historical information, weightings, human inputs or statistical probabilities.

17. A method for monitoring electrical faults in a power plant electrical distribution system, comprising:
monitoring and sampling in real time with an EDS electrical fault monitor (EFM) operation state (OS) radio frequency (RF) emissions data from electrical distribution system (EDS) equipment that are obtained with a plurality of time synchronized radio frequency monitors (RFM) that are distributed about the EDS and coupled to the EFM, the OS RF emissions potentially indicative of electrical faults in the EDS;
storing in an automated data storage device that is coupled to the EFM OS data samples for each RFM, sampled data including the RFM identification, data sample time and data sample waveform characteristics;
determining with the EFM in real time a likelihood of whether one or a combination of the respective OS data samples is indicative of an electrical fault by:
referencing in an automated data storage device coupled to the EFM previously stored electrical fault information obtained by the RFMs, resulting from generating electrical fault RF test signals with an RF test generator in the EDS; and
comparing the sampled OS data with the previously stored electrical fault information in the automated data storage device; and
causing the EFM to generate an alarm when the referenced stored information associates the sampled OS data with an electrical fault within the EDS.

18. The method of claim 17, the previously stored information in the automated data storage device including any of rules, set points, absolute reading limits, RF waveforms, time differences between receipt of data samples by different RFMs, historical information, weightings, human inputs or statistical probabilities; and the determining step performed in the EFM using any of fuzzy logic, self-learning, algorithmic, statistical, neural network logic, case-based reasoning or heuristic methods.

* * * * *